United States Patent
Visconti (10) Patent No.: US 11,063,631 B2
(45) Date of Patent: Jul. 13, 2021

(54) SMART SHELF POWER AND DATA TRANSMISSION SYSTEM

(71) Applicant: Lozier Corporation, Omaha, NE (US)

(72) Inventor: Tony Visconti, Mississauga (CA)

(73) Assignee: Lozier Corporation, Omaha, NE (US)

( * ) Notice: Subject to any disclaimer, the term of this patent is extended or adjusted under 35 U.S.C. 154(b) by 0 days.

(21) Appl. No.: 16/752,060

(22) Filed: Jan. 24, 2020

(65) Prior Publication Data

US 2020/0244313 A1   Jul. 30, 2020

Related U.S. Application Data

(60) Provisional application No. 62/796,162, filed on Jan. 24, 2019.

(51) Int. Cl.
| | | |
|---|---|---|
| *H04B 3/54* | (2006.01) | |
| *H05K 7/02* | (2006.01) | |
| *H02J 3/00* | (2006.01) | |
| *H02J 13/00* | (2006.01) | |
| *A47B 97/00* | (2006.01) | |
| *A47F 11/10* | (2006.01) | |

(52) U.S. Cl.
CPC ............ *H04B 3/542* (2013.01); *A47B 97/00* (2013.01); *A47F 11/10* (2013.01); *H02J 3/00* (2013.01); *H02J 13/00006* (2020.01); *H04B 3/548* (2013.01); *H05K 7/02* (2013.01); *A47B 2220/0077* (2013.01); *A47B 2220/0091* (2013.01)

(58) Field of Classification Search
CPC ............ H04B 3/54; H04B 3/542; H04B 3/56
USPC ........................................................ 375/257
See application file for complete search history.

(56) References Cited

U.S. PATENT DOCUMENTS

| | | | | |
|---|---|---|---|---|
| 4,342,013 A * | 7/1982 | Kallman | ................ | H02H 9/005 |
| | | | | 177/185 |
| 5,994,998 A * | 11/1999 | Fisher | ..................... | H04L 12/10 |
| | | | | 375/258 |
| 7,414,429 B1 * | 8/2008 | Kim | ................. | H03K 19/17744 |
| | | | | 326/37 |
| 8,779,931 B2 | 7/2014 | Yaney et al. | | |

(Continued)

OTHER PUBLICATIONS

GPE2001 G.HN Powerline to Ethernet Extender; Reference Noteshttps://www.anis.com/globalassets/resources/data-sheets/gpe2001.pdf; Jan. 23, 2019.

(Continued)

*Primary Examiner* — Shuwang Liu
*Assistant Examiner* — Gina M McKie
(74) *Attorney, Agent, or Firm* — Erickson Kernell IP, LLC; Mark C. Young (57) ABSTRACT

A powerline data transmission system for smart shelves provides AC power and network data propagated over a single cable. In disclosed embodiments, a starter unit encodes an ethernet signal onto an alternating current power source with a driver unit decoding the ethernet signal from the power source to provide separate power and data at a location such as a shelving unit bay. The separated power and data signals are provided to a technology box which communicates power and data to sensors positioned on the shelves of the unit. A support structure for the smart shelf system provided mounting of the driver unit and technology box along the top of the shelving unit or in a lower tray of the unit.

15 Claims, 9 Drawing Sheets

(56) References Cited

U.S. PATENT DOCUMENTS

| | | |
|---|---|---|
| 8,941,976 B1 | 1/2015 | Maroney |
| 9,531,434 B1 | 12/2016 | Cardama Sierra |
| 2006/0214792 A1* | 9/2006 | Goyal ................ G06Q 50/30 340/572.1 |
| 2008/0190639 A1* | 8/2008 | Baran ................... H04B 3/56 174/50 |
| 2009/0243797 A1* | 10/2009 | Leung ............... G07F 17/0092 340/5.73 |
| 2013/0117584 A1 | 5/2013 | Chan et al. |
| 2014/0176340 A1 | 6/2014 | Liang et al. |
| 2018/0034882 A1 | 2/2018 | Coglitore |
| 2018/0235383 A1* | 8/2018 | Josey .................. A47F 5/0043 |
| 2018/0287666 A1 | 10/2018 | Kornek-Percin et al. |
| 2020/0184230 A1* | 6/2020 | Liu .................. G06K 9/00342 |

OTHER PUBLICATIONS

000 Mbps HomePlug AV2 Powerline Pass-Thru 2-Port Gigabit Ethernet Adapter; Reference Notesftp://ffp.2yxel.com/PLA5456/datasheet/PLA5456_2.pdf; Jan. 23, 2019.

Split Phase Repeater (SPR-1); Reference Noteshttp://www.pcslighting.com/pulseworx/products/tools/spr#technical-specs; Jan. 23, 2019.

* cited by examiner

SMART SHELF POWER AND DATA TRANSMISSION SYSTEM

CROSS-REFERENCE TO RELATED APPLICATIONS

This application claims the benefit of provisional patent application Ser. No. 62/796,162, filed Jan. 24, 2019, entitled SYSTEM AND METHOD FOR POWERLINE DATA TRANSMISSION, the contents of which are incorporated herein by reference

BACKGROUND

Wired transmission of data between networked devices typically requires the use of individual Ethernet cables routed to each device on the network, with each device further requiring a power supply and/or connection to a power mains, which thus requires further cabling and positioning of power supplies for the devices. While such configurations are acceptable for dedicated server rooms or for wiring office buildings, the bulk and substance of such technology is generally not suitable for use in public-facing applications, such as smart shelving and displays.

In smart shelf applications the wiring and data transmission infrastructure is preferably invisible to the consumer—bundles of cables and multiple visible wiring and junction boxes not only detract from the aesthetic appearance of the smart shelves, but visible and accessible wiring and cabling is susceptible to damage and takes up space that would preferably be dedicated to product display and storage. Current technology for smart shelf sensors typically require a dedicated Ethernet cable and dedicated power cable per shelf having one or more sensors, or in some cases a separate cable for each sensor. Thus, a shelving unit having four shelves requires at least four separate power cords and four separate Ethernet cables, with each shelving unit likewise requiring multiple cables.

Because of the lack of an integrated approach to power and data distribution, retailers and other product sellers employing smart shelf technology typically separate the current functionality to discrete areas. For example: promotional efforts—focusing on customer engagement, dynamic pricing, and cross selling; transactional efforts—focusing on secure product access and easy check out; and operational efforts—focusing on inventory and consumer behavior; are all generally separately managed without the benefit of any integrated data sharing therebetween.

As discussed above, the use of dedicated Ethernet cables to each shelf or device requires large bundles of cables and power supply boxes to be distributed and managed, with the cabling and power supplies themselves take up valuable space in the shelf unit. In addition to the initial installation and cabling, bundling, etc. such a configuration makes any changes or additions difficult. For example, a smart shelf system with dedicated ethernet cables and power supplies to each shelf does not allow expansion or reconfiguration without likewise reworking the cabling and power supplies.

While Power over Ethernet (POE) provides some benefit by mitigating the need for separate power supplies, POE is not without its own problems. POE operates at a fixed voltage, with limited current capability, and limits data transmission speed. And, each device still requires its own dedicated Ethernet cable to provide power and data. Furthermore, the run length of POE is relatively short—typically less than three-hundred feet. Thus, while POE in some instances provides improvement over separate Ethernet and power supply solutions, POE itself has significant limitations.

Thus, it can be seen that there remains a need in the art for an integrated power and data infrastructure that can be used in conjunction with smart shelf systems and is adaptable for use with other applications.

SUMMARY

Embodiments of the invention are defined by the claims below, not this summary. A high-level overview of various aspects of the invention are provided here for that reason, to provide an overview of the disclosure, and to introduce a selection of concepts that are further described in the detailed description section below. This summary is not intended to identify key features or essential features of the claimed subject matter, nor is it intended to be used as an aid in isolation to determine the scope of the claimed subject matter.

In one aspect, the system of the present invention provides an integrated power and data distribution system, with AC power and network data propagated over a single cable. In another aspect, the system of the present invention provides long distance transmission of data at speeds of up to one gigabit per second over conventional 120 VAC power lines and connectors. In another aspect, the powerline used for transmission of data is simultaneously used to provide power to devices connected to the network. In yet another aspect, multiple devices may be daisy chained to form a network of devices, with a single cable providing power and data communication between devices. In a further aspect, the power and data is available to external devices and systems integrated into structural devices such that those external devices can be attached to the network. In yet another aspect, the power and data distribution system is integrated into a smart shelf system, with multiple shelving units or gondolas capable of being daisy chained together over a single cable, and with power and data connections provided to individual technology boxes located within each shelving unit, with a single cable providing power and data communication between separate shelving units.

DESCRIPTION OF THE DRAWINGS

Illustrative embodiments of the invention are described in detail below with reference to the attached drawing figures, and wherein.

DETAILED DESCRIPTION

The subject matter of select embodiments of the invention is described with specificity herein to meet statutory requirements. But the description itself is not intended to necessarily limit the scope of claims. Rather, the claimed subject matter might be embodied in other ways to include different components, steps, or combinations thereof similar to the ones described in this document, in conjunction with other present or future technologies. Terms should not be interpreted as implying any particular order among or between various steps herein disclosed unless and except when the order of individual steps is explicitly described. The terms "about", "approximately", or other terms of approximation as used herein denote deviations from the exact value in the form of changes or deviations that are insignificant to the function.

Figure 1:
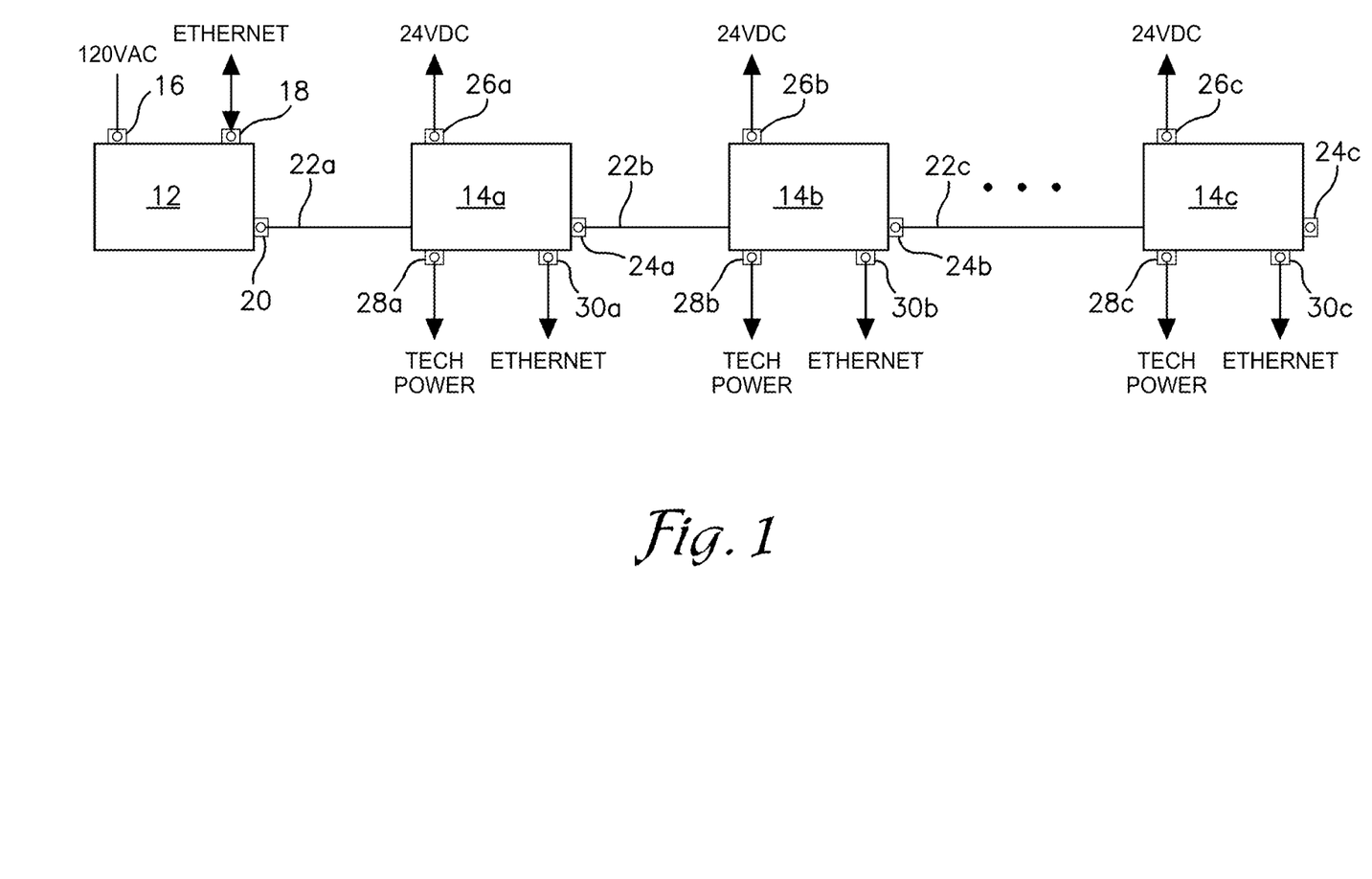
FIG. 1 is a block diagram of a powerline data transmission system in accordance with a first exemplary embodiment of the present invention.

Looking first to FIG. 1, a block diagram of a powerline data transmission system for a smart shelf in accordance with an exemplary embodiment of the present invention is depicted generally as numeral 10. System 10 includes a starter unit 12 in communication with a first driver unit 14a, which is in turn in communication with a second driver unit 14b, which is likewise in communication with a third communication unit 14c. As indicated by the ellipses " . . . " in FIG. 1, it should be understood that the system may comprise any number of driver units—up to approximately 63—daisy chained in series from the single starter unit.

Starter unit 12 receives 120 volt AC power via powerline connector 16, and receives a bidirectional computer network data signal via Ethernet connector 18. As will be described in more detail hereinbelow, the starter unit 12 combines the network data signal onto the AC power signal to provide an encoded powerline communications signal (PLC) to output connector 20, the PLC signal comprising both AC power and network data on a standard three wire (line-neutral-ground) power cable. The starter unit establishes a network, allowing up to sixty-three driver units to be connected into the network downstream of the driver unit. Filtering circuitry in the starter unit, as described in more detail hereinbelow, prevents the PLC signal from propagating upstream of the driver unit (i.e., outside of the established network) through the powerline connector 16, so that multiple starter units and associated driver units may be employed on a single powerline or power system or subsystem without interfering with each other.

First driver unit 14a preferably connects to the starter unit via a cable 22a connected the PLC output connector 20 of the driver unit 12 using a standard three wire AC cable and plug, thus receiving both 120 VAC power and computer network data signals over the single cable 22a. Driver unit 14a passes the PLC power/data signal to its own output connector 24a, thus allowing the next driver unit 14b to likewise receive power and data via a cable 22b plugged into the output connector 24a of the previous driver. Driver unit 14b likewise passes the PLC power/data signal to its output connector 24c, allowing subsequent driver unit 14c to receive the integrated PLC signal via its cable 22c. It should be understood that the system 10 can support any number of driver units, up to approximately 63, with each subsequent driver unit plugging in to the prior driver unit to receive the integrated power and data PLC signals over a standard power cable and connector.

With the starter unit 12 connected to one or more driver units, the system forms a network, with the Ethernet data signal from the PLC available for interconnection to multiple devices attached to the network, and allowing those devices to communicate as if connected in a conventional computer network.

In the exemplary embodiments described herein, the power connection is preferably a standard three wire 120 VAC power cable, comprising line, neutral, and ground wires. The data connection is preferably a standard Ethernet connection, with data transmission speeds of up to 1 gigabit per second. The output connector presenting the PLC signal on the starter and driver units is preferably a three prong, standard 120 VAC socket, with a standard three prong 120 VAC plug on the driver unit plugging in to the socket on the previous driver unit (or on the starter unit, in the case of the first driver unit 14a) to receive the power and data signals from the previous unit.

It should be understood that while the exemplary embodiments depict 120 VAC and standard Ethernet connections, that other configurations are within the scope of the present invention. For example, the present invention may be adapted for use with AC voltage other than 120 VAC, for example, with 240 VAC systems, and using the appropriate electrical connectors, sockets, and plugs for that voltage. Likewise, the Ethernet connection may be via a standard RJ45 connector, or may be over other connections, such as Ethernet over coax. These and other variations are contemplated by the present invention.

Looking still to FIG. 1, in addition to passing through the PLC power/data signal, each driver unit 14a, 14b, 14c, further provides separate power and data outputs as will now be described. Driver unit 14a provides a 24 VDC output 26a for connection to a shelf light power track which allows connection of lighting modules to the shelving units as desired. Driver unit 14a also provides a power output 28a for powering smart shelf technology equipment boxes, as well as an Ethernet data connection 30a for communicating with those technology boxes. Driver units 14b and 14c, have similar 24 VDC outputs 26b, 26c, as well as similar technology power 28b, 28c, and Ethernet data 30b, 30c connections, as would subsequent driver units connected to the same starter unit 12. Preferably, the VDC output of the driver units provide up to 48 VDC to the technology boxes. Most preferably, the output voltage of the driver unit is adjustable to accommodate voltage requirements of various vendors' technology boxes.

Used in conjunction with a smart shelf system, the equipment technology boxes powered by the power outputs 28a, 28b, 28c of the driver units 14a, 14b, 14c, may be any smart shelf technology provided by a vendor and desired to be used with the shelf unit or bay associated with the driver unit, such as weight sensing technology, proximity technology, location technology, or other smart shelf sensing or informational technology.

Figure 2:
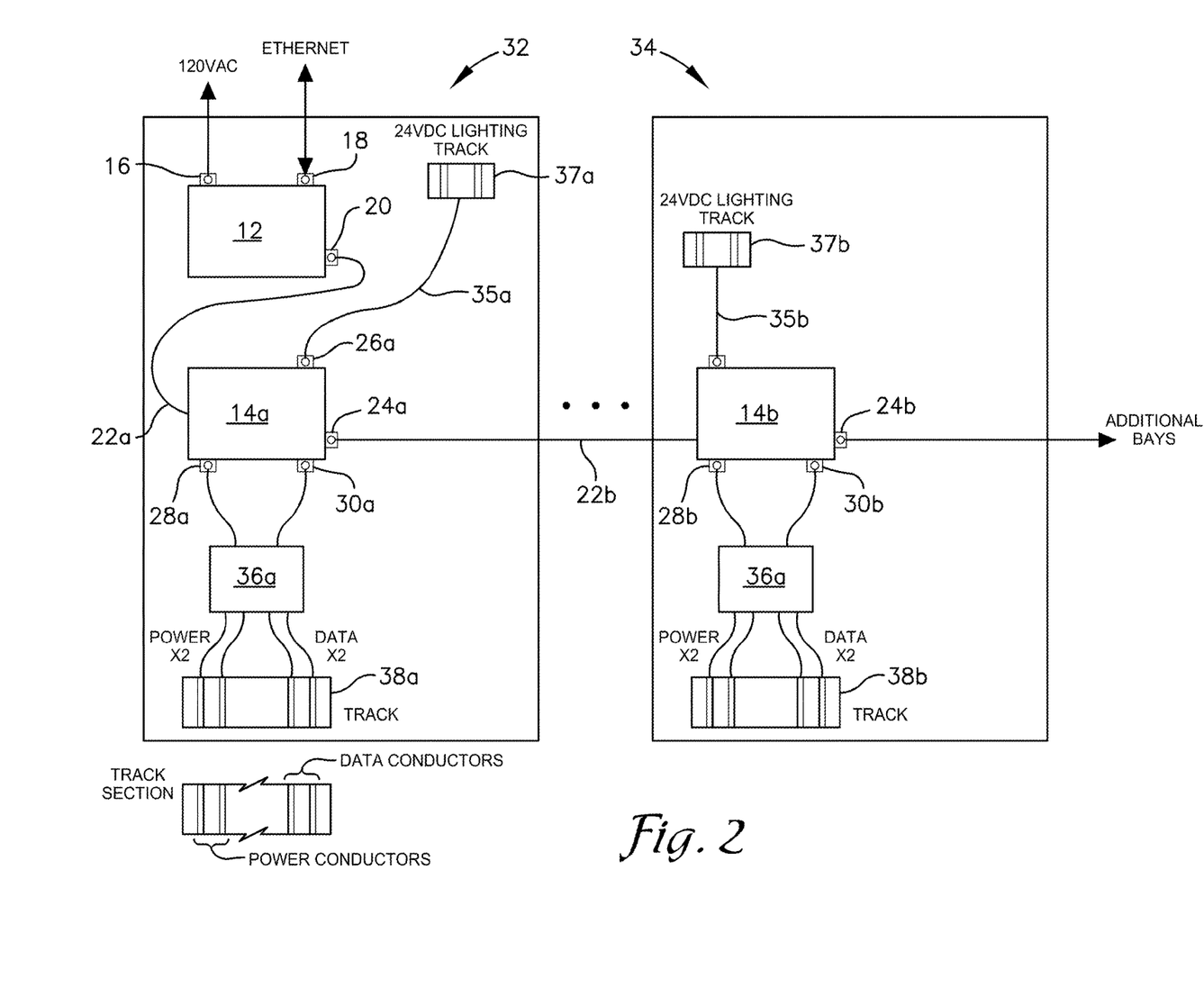
FIG. 2 is a block diagram of a powerline data transmission system distributed into shelving bays in accordance with an exemplary embodiment of the present invention.

Looking to FIG. 2, in an exemplary embodiment, the starter unit and driver units as just described are depicted in separate shelving bays 32, 34 of a shelving unit. The first bay 32 includes a starter unit 12 and a driver unit 14a, interconnected as previously described. Starter unit 12 receives 120

VAC to connector 16 from the local power system or subsystem, with Ethernet provided to connector 18. As described previously, the starter unit provides a PLC output to connector 20, comprising 120 VAC with an encoded Ethernet data signal. Driver unit 14a plugs in to connector 20 of the starter unit 12 so that the driver unit receives power and encoded Ethernet signals. Decoder circuitry within the driver unit 14a decodes the Ethernet signal, and provides a power output 28a and Ethernet to power a technology box 36a located in the bay 32. Technology box 36a may be any type of input, sensor or data acquisition unit for use with a smart shelf unit. The technology box 36a provides two power lines and two Ethernet data lines to a four-conductor track 38a positioned within the bay 32a. The four conductor track preferably extends vertically within the shelf bay unit or gondola, allowing sensors or data acquisition units associated with each shelf in the unit to attach to the track and receive power and communicate with the technology box 36a. Thus, for example, a technology box 36a supporting weight sensors for shelves would provide power and data lines to the track 38a, and the individual weight sensors for each shelf would connect to the track to receive power and enable communication with the technology box 36a. Preferably, the power conductors of the track can provide ninety-six watts of power to connected devices. The technology box 36a likewise enables communication to the driver unit 14a, which in turn provides communication along the entire network, and back to the Ethernet input 18 of the starter unit as previously described. As also previously described, the driver unit 14a further provides 24 VDC power via connector 24a and cable 35a to a lighting track 37a on the bay or unit to allow connection of standard lighting units to that track.

Looking still to FIG. 2, a second bay 34 includes a driver unit 14b connected to the driver unit 14a of the first bay 32. In the manner as previously described, the cable 22b connecting the driver unit 14b to the first driver unit 14a provides 120 VAC power along with encoded Ethernet for data communication. In the second bay 34, the driver unit 14b provides power to a second technology box 36b which provides power and data connections to a four-conductor track 38b for powering sensors or other data acquisition units associated with the second technology box 36b. Those sensors and units can thus communicate to the second technology box 36b, which can further communicate over the Ethernet data connection as previously described.

It should be understood that multiple bays may be further connected in a manner similar to that just described, with each bay including a driver unit and a technology box connected to that driver unit. It should be further understood that the technology in each bay need not be identical to that in the prior or subsequent bays, and that each technology box and track may provide a distinct technology to the system. In alternative embodiments, it should be apparent that two driver units may be configured in a single bay or shelving unit to support two technologies within that bay, with a separate track and technology box associated with each.

It should be noted that, as depicted in FIG. 2, the interconnection between the first bay 32 and the second bay is a single cable 22b which provides power and Ethernet connections to each bay. Thus, there are no bundles of power and Ethernet cables running to each bay and/or between the bays, the single cable between the bays provides the power and data to each. Compared to a conventional system employing power and Ethernet cables to each separate sensor or device, the system of the present invention can achieve a reduction in the number of interconnecting cables by approximately ninety-six percent in a typical system previously using four-hundred and eighty cable drops, to twenty cable drops for a comparable system employing the system of the present invention.

Figure 3:
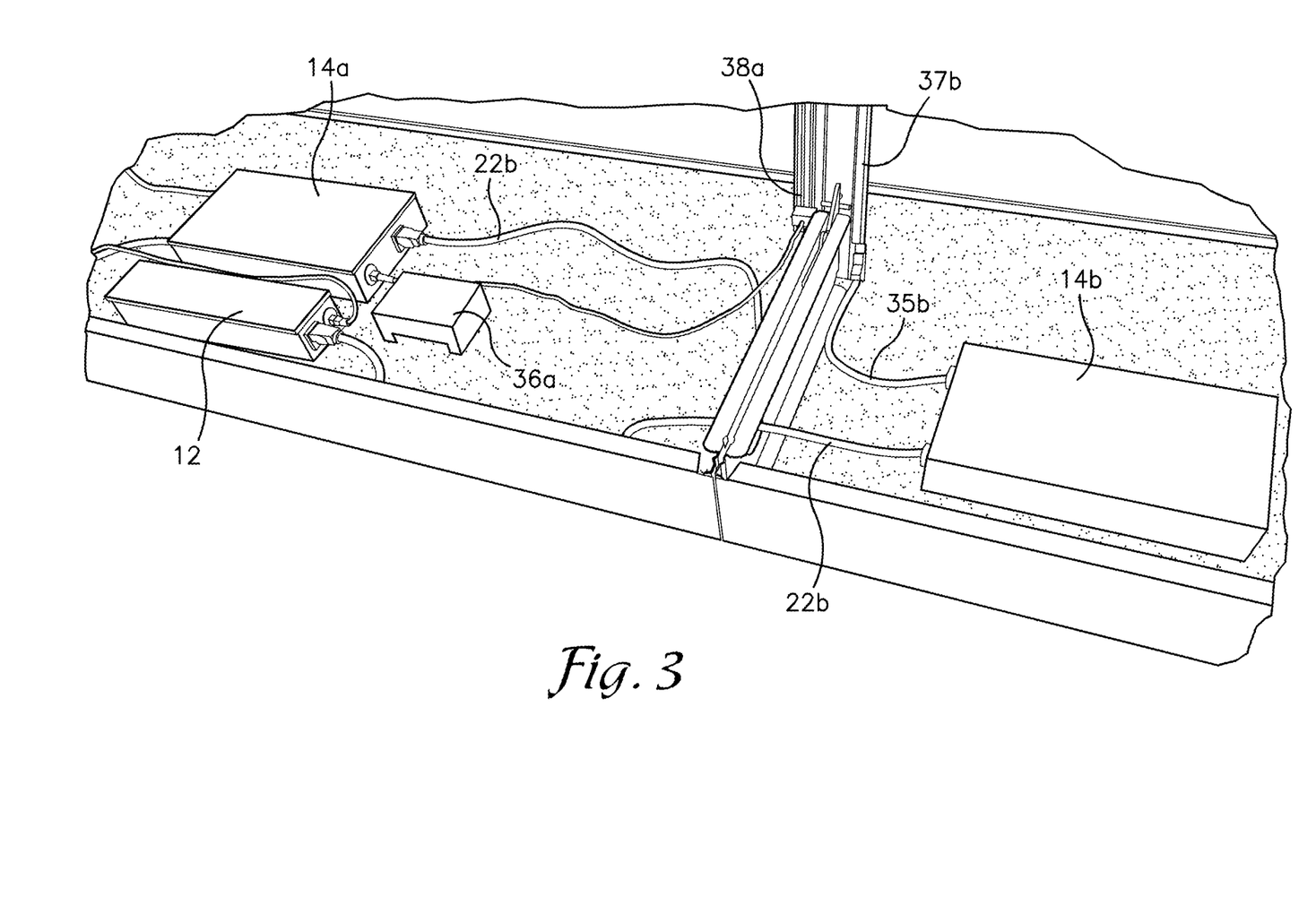
FIG. 3 is a perspective view of a starter unit and two driver units positioned in bays of a shelving unit in accordance with an exemplary embodiment of the powerline data transmission system of the present invention.

Looking to FIG. 3, in an exemplary implementation of the system as just described, a first bay includes a starter unit 12 and a driver unit 14a, with a technology box 36a connected to the driver unit 14a as previously described. The power and data lines of the technology box 36a connect to the track 38a which extends vertically upwardly along the back of the bay to allow connection of sensors or other devices associated with the technology box 36a. A second driver unit 14b in a second bay connects to the first driver unit 14a via PLC cable 22b which provides power and data to the second driver unit 14b. A lighting track 37b receives 24 VDC power from the driver unit 14b to allow connection of lighting features to the shelve of the bay.

Figure 4A:
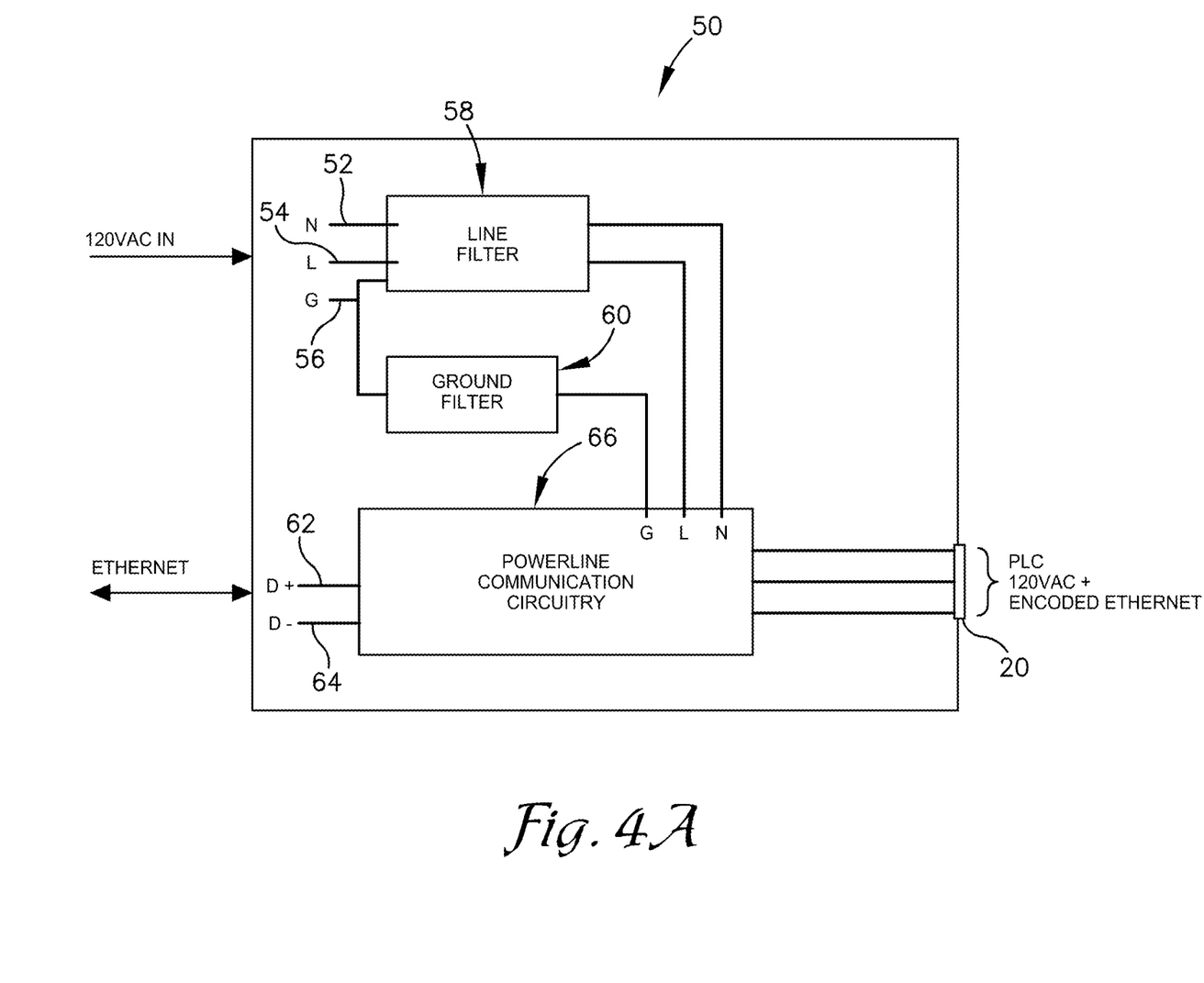
FIG. 4A is a block diagram of starter unit circuitry of a powerline data distribution system in accordance with an exemplary embodiment of the present invention.

Turning to FIG. 4A, a schematic block diagram of the starter box circuitry is depicted generally by the numeral 50. As seen in the figure, the 120 VAC input power to the starter box comprises neutral 52, line 54 and ground 56 wires. The neutral and line power input wires are connected to high frequency line filter circuitry 58, with the ground wire 56 connected to ground filter circuitry 60. The filtered neutral, line, and ground wires then connect to the powerline communication circuitry 66. Also input to the starter box are two Ethernet data lines, D+ 62 and D– 64, providing a data signal, which also connect to the powerline communication circuitry 66.

The powerline communication circuitry 66 converts the incoming Ethernet data signal to a high frequency signal which is encoded onto the 60 Hertz powerline signal. Preferably the frequency of the encoded signal is in the range of 30 to 80 Megahertz (MHZ). Most preferably, the powerline communication circuitry uses a multiple in, multiple out (MIMO) scheme that utilizes all three of the line, neutral, and ground wires to encode the Ethernet data signal. The Ethernet data is preferably modulated on top of the 60 Hertz 120 VAC line frequency so that the Ethernet data is effectively encoded onto the power signal. The output signal from the powerline circuitry thus includes the 120 VAC power as well as the encoded Ethernet data signal. The driver units, downstream from the starter unit as described previously, decode the encoded Ethernet data signal by demodulating the high-frequency data signal from the 60 Hertz carrier signal and provide a separate Ethernet data signal for use by connected equipment.

Because the data signal is encoded onto all three of the power lines (line, neutral, and ground), the line filter and ground filter circuitry preferably each comprise inductors and capacitors connected between each combination of lines—i.e, line to neutral, line to ground, and neutral to ground.

Figure 4B:
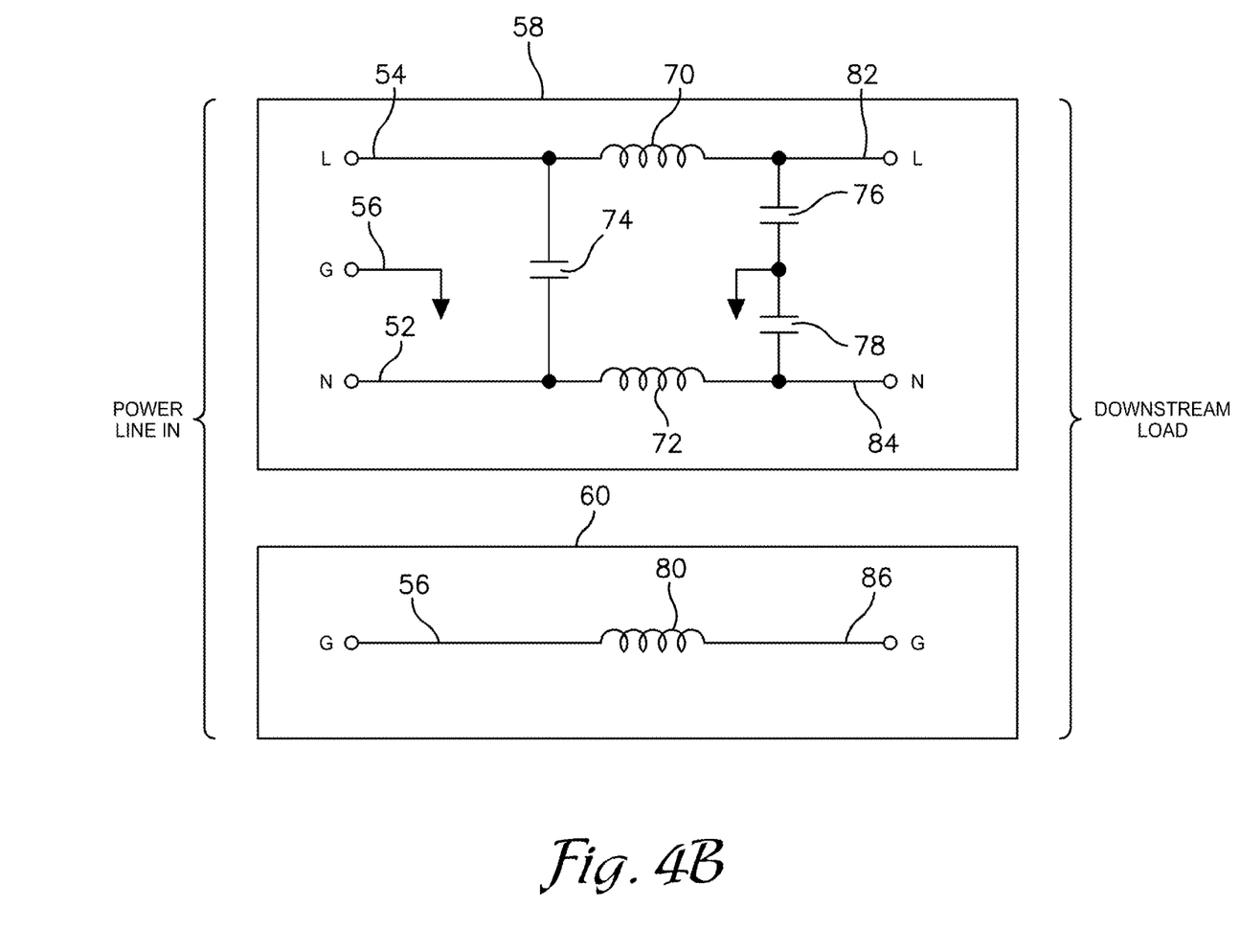
FIG. 4B is a schematic diagram of the line filter and ground filter portions of the starter unit circuitry of FIG. 4A.

Looking to FIG. 4B, a schematic diagram of the line filter 58 and ground filter 60 circuitry is depicted. Line filter circuitry 58 includes inductors 70, 72 in series with each of the line 54 and neutral 52 input lines. A first capacitor is connected between line 54 and neutral 52 lines on the input side of each of the inductors 70, 72. Second and third capacitors 76, 78 are connected in series between the line 82 and neutral 84 lines on the output or downstream side of the inductors 70, 72, with the junction between capacitors 76, 78 connect to ground 58. Ground filter circuitry 60 comprises an inductor 80 in series with the ground line 56 between the input/upstream side and output/downstream side 86.

Inductors 70, 72 in the line filter circuitry are preferably have an inductance in the range of 0.5 millihenries to 1.0 millihenries. Most preferably they are 0.7 millihenries. First capacitor 74 preferably has a capacitance in the range of 0.2 microfarads to 0.4 microfarads. Most preferably capacitor 74 is a type X2 capacitor, with a capacitance of 0.3 microfarads. Second and third capacitors 76, 78 are preferably in the range of 3,000 picofarads to 4,000 picofarads. Most preferably capacitors 76, 78 are type Y capacitors, having a capacitance of 3,300 picofarads.

Inductor 80 in the ground filter circuitry 60 preferably has an inductance in the range of 80 to 120 microhenries. Most preferably inductor 80 has an inductance of 100 microhenries.

With the inductors and capacitors in the line filter circuitry 58 and ground filter circuitry 60 as just described, that circuitry preferably provides approximately 50 to 60 dB of attenuation of frequencies up to approximately 60 Megahertz between the upstream, power line in side and the downstream, load side of the filter circuitry.

Thus, line filter circuitry 58 and ground filter circuitry 60 are operable to attenuate the PLC signal to prevent propagation of the ethernet encoded signal upstream and outside of the network established by the starter unit. Thus, multiple driver units may be operated on the same powerline system, with each starter unit creating its own network of up to sixty-three daisy chained driver units, without interfering with other driver units or starter units on the same power system or subsystem.

As set forth, the powerline data transmission of the present invention provides 120 VAC power and Ethernet communication to a plurality of gondolas or shelving units from a single initial 120 VAC power supply and an initial Ethernet cable. Interconnections between consecutive shelving units is achieved through a single three conductor power cable, with power and data communication provided over that single cable. Using the single cable connection, the system can provide up to 15 amps of current distributed over the plurality of shelving units, with Ethernet data communications speeds of up to 1 gigabit per second.

Figure 5:
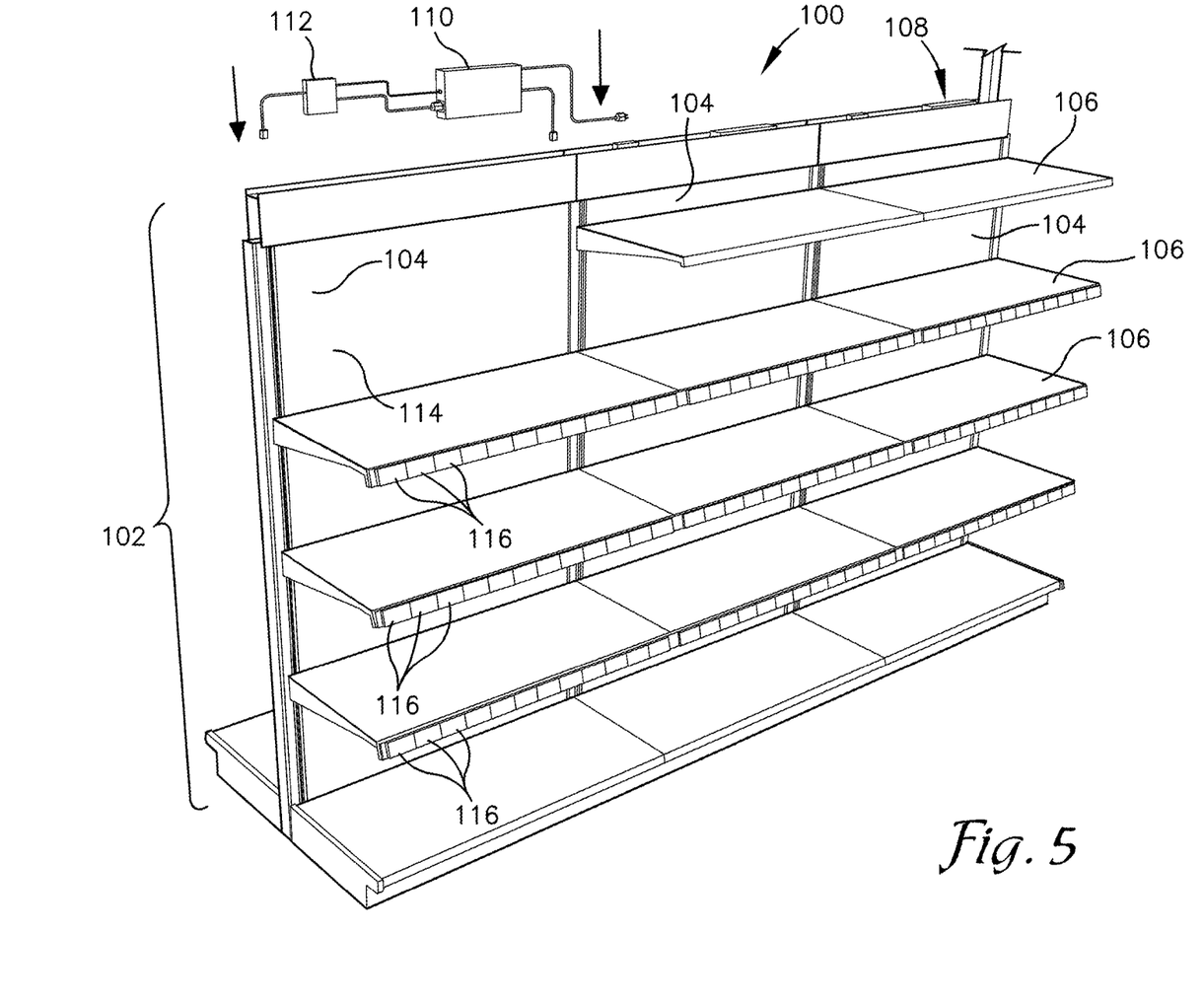
FIG. 5 is a perspective view of a shelving gondola unit incorporating a powerline data distribution system in accordance with an exemplary embodiment of the present invention.

Looking to FIG. 5, a shelving unit housing a powerline data transmission system in accordance with an exemplary embodiment of the present invention is depicted generally by the numeral 100. The shelving unit 100 comprises a center structure 102 supporting a series of vertical back panels 104, with a plurality of shelves 106 attached to risers of the center structure 102. A square "U" shaped trough 108, the interior of the trough providing a housing to accommodate a driver unit 110 and technology box 112 as previously described. As depicted in the figure, the driver unit 110 and technology box 112, and associated wiring are inserted via the open top of the trough, and preferably secured within the trough. The technology box 112 provides power and data to a four-conductor track 114, with the track 114 providing power and data connections to the sensors 116 positioned on the front or each shelf 106. As described previously, the sensors on the shelf attach to the four-conductor track 114 to derive their power from the two power conductors in the track and communicate via the two data conductors in the track. Communication to and from the sensors is propagated through the track 114, through the technology box 112, and via the driver unit 110 in the manner previously described. As can be seen in the figure, the driver unit 110 also provides 24 VDC power to a lighting track on the shelving unit, and can be connected to a starter unit or adjacent driver unit via a power cord.

Thus, as seen in FIG. 5, each column of shelving may communicate to a separate driver unit so that various sensor technologies may be mixed in adjacent shelving. As is also apparent, the entire shelving unit may connect to another shelving unit via a single PLC power cord. Thus, interconnection of multiple units is accomplished via a single PLC power cord extending between the two, providing both power and data communications.

Figure 6:
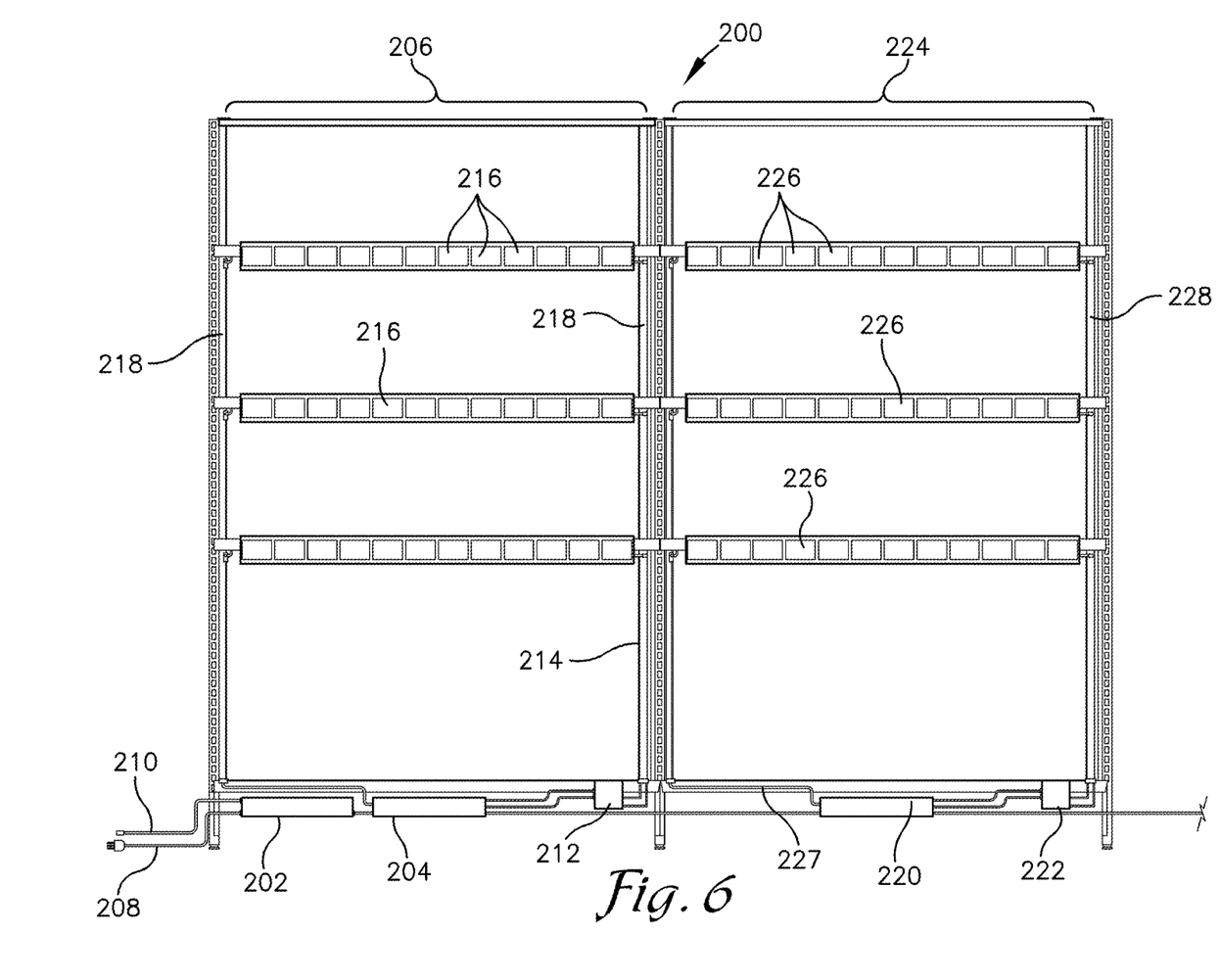
FIG. 6 is a front view of a shelving unit incorporating a powerline data distribution system in accordance with an exemplary embodiment of the present invention.

Looking to FIG. 6, an alternative embodiment of a shelving unit having a powerline data transmission system in accordance with an exemplary embodiment of the present invention is depicted by the numeral 200. In this embodiment, a starter unit 202 and driver unit 204 are positioned in a lower tray of a first bay 206 of the unit, with the starter unit 202 connectable to 120 VAC power 208 and Ethernet 210. A technology box 212 is positioned in the lower tray in communication with a four-conductor track 214 extending vertically along the back of the shelving unit. Technology 216 corresponding to the technology box 212 is attached to each shelf of the bay, with the technology 216 connected to the track 214. A 24 VDC lighting track 218 is positioned along each side of the bay to allow connection of lighting features. A second driver 220 and a second technology box 222 are positioned in a second adjacent bay 224, with a single PLC cable 227 providing power and Ethernet data communication between the two bays. The technology box 222 of the second bay 224 is similarly connected to sensors 226 or other technology on the shelves of the second bay 224 via the four-conductor track 228 on that bay. As described above, it should be understood that the technology used in the first bay 206 may differ from the technology used in the second bay 224 as each uses a separate driver unit 204, 220. However, each interconnects via the single PLC cable 227 which provides power and data communication to the bay regardless of the technology being used in that bay.

Figure 7:
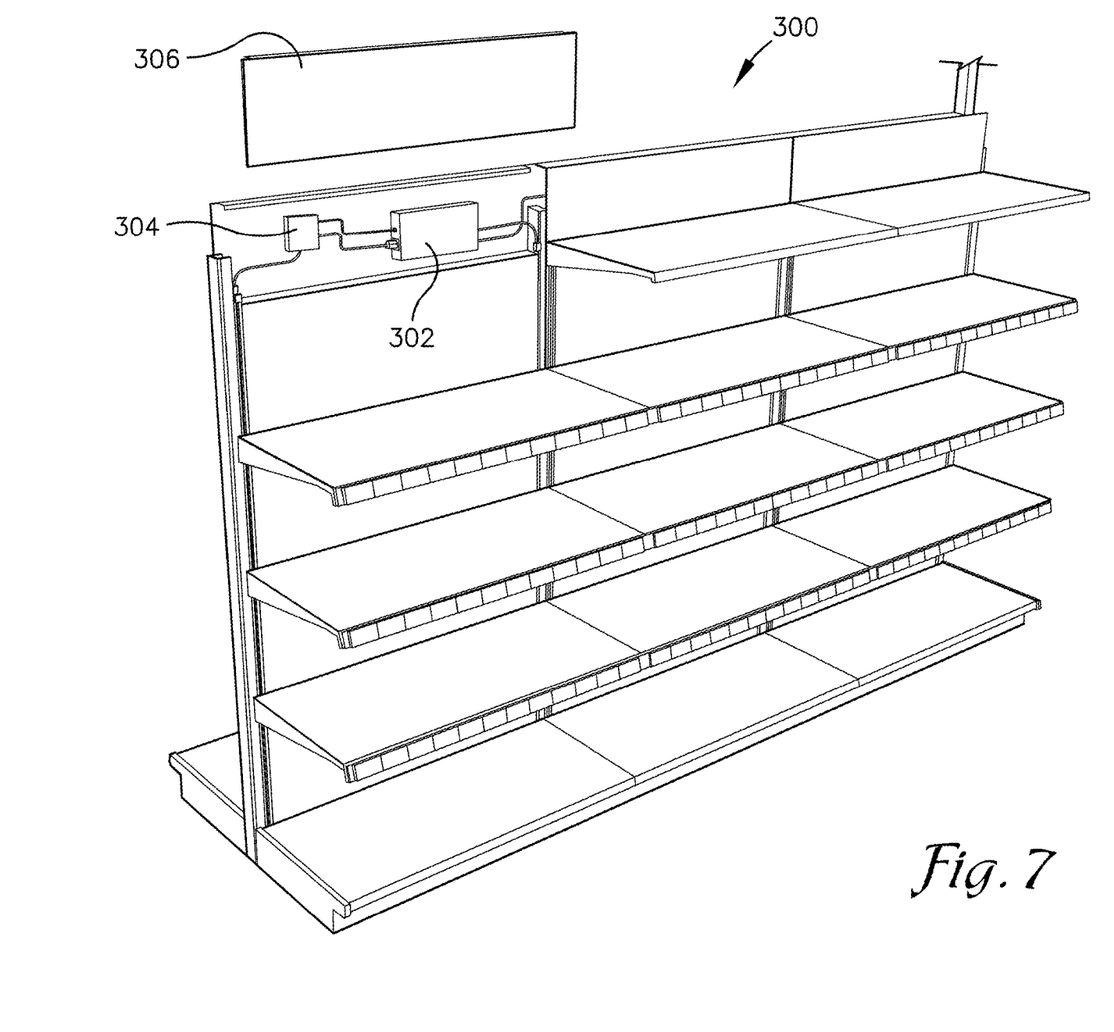
FIG. 7 is a perspective view of a shelving unit is incorporating a powerline data distribution system in accordance with an exemplary embodiment of the present invention.

Turning to FIG. 7, in an alternative embodiment of the present invention, a shelving unit 300 includes a driver unit 302 and technology box 304 mounted behind a removable panel 306 that forms a mounting cavity along the top edge of the unit. The driver unit 302 and technology box 304 are connected to the unit in a manner similar to that described with respect to FIG. 5.

Figure 8:
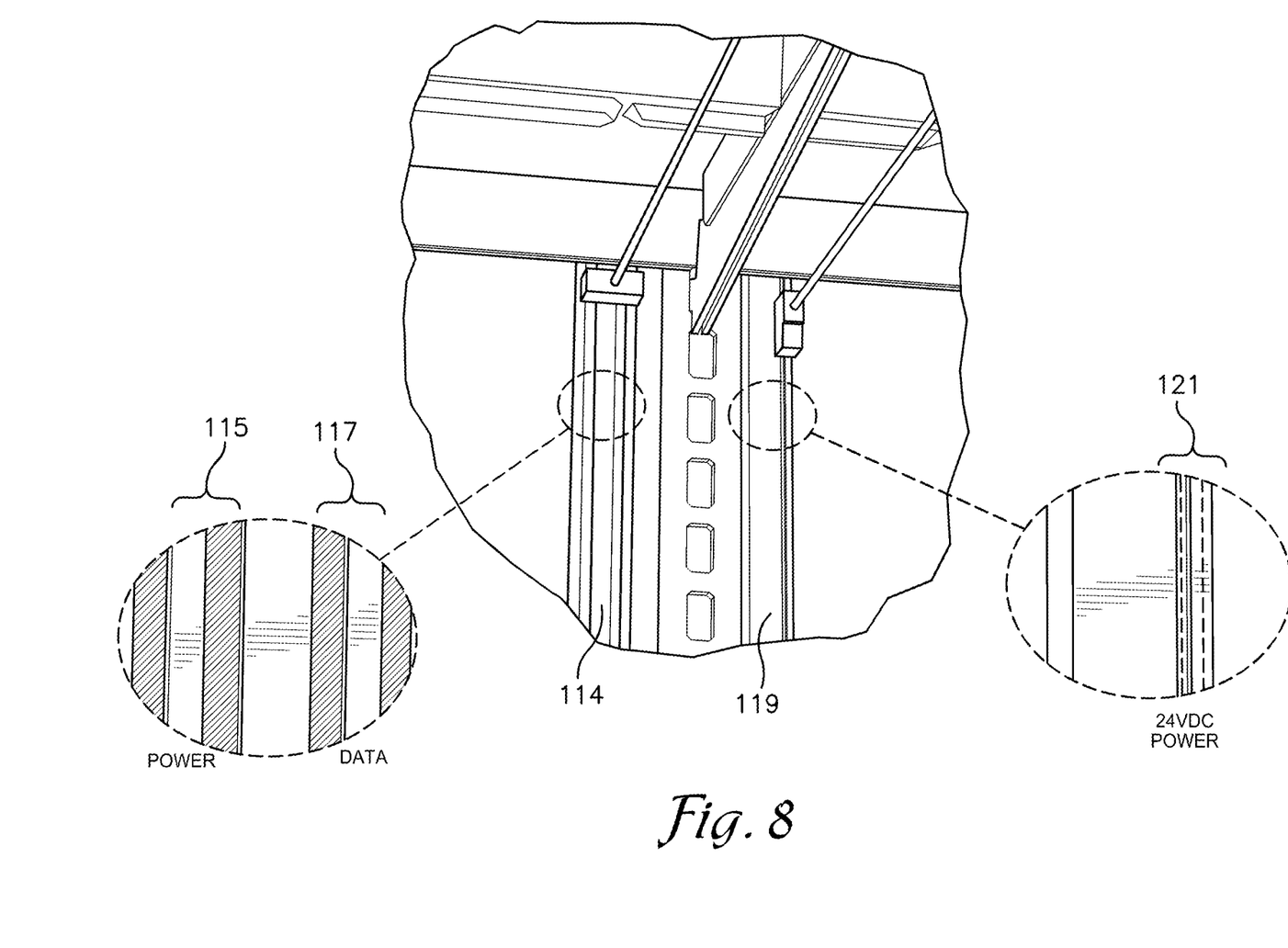
FIG. 8 is a close-up partial view of a track system of a shelving unit incorporating the powerline data distribution system in accordance with an exemplary embodiment of the present invention.

Looking to FIG. 8, a partial close-up view of a portion of the shelving unit of FIG. 5, depicts a four-conductor PLC track 114, having two power conductors 115 and two data conductors 117, distributing the power and data communications along the track and through the shelving unit. A two-conductor lighting track 119 includes two power conductors 121 carrying 24 VDC power for lighting features.

As described herein, the present invention is well adapted to provide power and data communication between multiple smart shelf units, eliminating the need for multiple cable drops to a single shelving unit, and allowing interconnection of adjacent and/or subsequent shelving units via a single PLC cable. Expansion and reconfiguration of a set-up is thus accomplished via a single power and data cable without necessitating running additional cables from a central location.

While the powerline data transmission system described herein has been described in conjunction with smart shelf systems, it should be understood that the invention may be adapted to other applications other than shelving. For example, modular office cubicles may be configured with starter units, driver units, and tracks in a manner similar to that described herein with respect to shelving units. Power and data transmission between adjacent cubicles would be accomplished using a single PLC cable as described herein, and access to power and data for use within the cubicle would allow network connection without requiring separate cable drops for each cubicle. These and other configurations are within the scope of the present invention.

The subject matter of select embodiments of the invention is described with specificity herein to meet statutory requirements. But the description itself is not intended to necessarily limit the scope of claims. Rather, the claimed subject matter might be embodied in other ways to include different components, steps, or combinations thereof similar to the ones described in this document, in conjunction with other present or future technologies. Terms should not be interpreted as implying any particular order among or between various steps herein disclosed unless and except when the order of individual steps is explicitly described.

What is claimed is:

1. A powerline data transmission system for a smart shelf system, comprising:
    a starter unit configured to:
        connect to an alternating current power source,
        connect to an Ethernet data signal,
        encode the data signal on the alternating current power source to provide a combined power and data signal, and
        propagate the combined power and data signal via a multiconductor cable;
    a plurality of driver units connected in series with the starter unit, wherein each driver unit is operable to:
        receive the propagated combined power and data signal from the starter unit or from an upstream driver unit,
        propagate the combined power and data signal via a multiconductor cable to a downstream driver unit,
        decode the data signal from the combined power and data signal, and
        provide a separated power supply and separated data signal to a technology box for use with a smart shelf system; and
    a multiconductor track in electrical communication with the technology box, the track configured to distribute power and data communications signals to a plurality of shelves of the smart shelf system.

2. The powerline data transmission system of claim 1, wherein the starter unit comprises line and ground filtering circuitry configured to prevent propagation of the combined power and data signal back to the alternating current source.

3. The powerline data transmission system of claim 2, wherein the filtering circuitry comprises inductors, capacitors, and combinations thereof.

4. The powerline data transmission system of claim 1, wherein each driver unit is further operable to provide direct current voltage to a lighting track for powering lighting features of a shelf system.

5. A smart shelf system, comprising:
    a support structure configured to support a plurality of shelves, wherein each shelf is configured to receive one or more sensors;
    a starter unit configured to:
        connect to an alternating current power source,
        connect to an Ethernet data signal,
        encode the data signal on the alternating current power source to provide a combined power and data signal, and
        propagate the combined power and data signal via a multiconductor cable;
    a plurality of driver units connected in series with the starter unit, wherein each driver unit is operable to receive the combined power and data signal from the starter unit or from an upstream driver unit, propagate the combinee power and data signal via a multiconductor cable to a downstream driver unit, and to decode the combined signal into separate power supply and data signals; and
    a multiconductor track comprising a plurality of conductors in communication with each driver unit and operable to distribute the separate power supply and data signals to the plurality of shelves.

6. The smart shelf system of claim 5, further comprising a lighting track operable to distribute direct current along the shelf system for powering lighting features.

7. The smart shelf system of claim 5, wherein the support structure includes a trough configured to receive and conceal each driver unit.

8. The smart shelf system of claim 5, wherein the support structure includes a mounting cavity for receiving each driver unit and a panel configured to cover the mounting cavity and conceal each driver unit.

9. The smart shelf system of claim 5, wherein the support structure includes a lower tray configured to receive each driver unit and a technology box.

10. A smart shelf system, comprising:
    a support structure configured to support a plurality of shelves;
    a starter unit configured to connect to an alternating current power source and an Ethernet data signal and provide a combined power and data signal; signal;
    a plurality of driver units connected in series with the starter unit, where each driver unit is operable to receive the combined power and data signal and to decode the combined signal into separate power supply and data signals; and
    a multiconductor track comprising a plurality of conductors in communication with each driver unit and operable to distribute the separate power supply and data signals to the plurality of shelves.

11. The smart shelf system of claim 10, further comprising a technology box configured to communicate with sensors associated with one or more of the plurality of shelves.

12. The smart shelf system of claim 10, further comprising a lighting track operable to distribute direct current along the shelf system for powering lighting features.

13. The smart shelf system of claim 10, wherein the support structure includes a trough configured to receive and conceal each driver unit.

14. The smart shelf system of claim 10, wherein the support structure includes a mounting cavity for receiving each driver unit and a panel configured to cover the mounting cavity and conceal each driver unit.

15. The smart shelf system of claim 10, wherein the support structure includes a lower tray configured to receive each driver unit and a technology box.

* * * * *